(12) United States Patent
Vinshtok et al.

(10) Patent No.: US 8,456,271 B1
(45) Date of Patent: Jun. 4, 2013

(54) OPTICAL PROXIMITY SWITCH

(75) Inventors: Yevgeniy Vinshtok, Downingtown, PA (US); Peter Breh, West Chester, PA (US)

(73) Assignee: IFM Electronic GmbH, Essen (DE)

( * ) Notice: Subject to any disclaimer, the term of this patent is extended or adjusted under 35 U.S.C. 154(b) by 0 days.

(21) Appl. No.: 13/438,880

(22) Filed: Apr. 4, 2012

(51) Int. Cl.
*H01C 10/50* (2006.01)

(52) U.S. Cl.
USPC .............. 338/200; 338/68; 338/162; 338/180

(58) Field of Classification Search
USPC ............................ 338/68, 162, 172, 180, 181
See application file for complete search history.

(56) References Cited

U.S. PATENT DOCUMENTS

| 4,044,327 | A | * | 8/1977 | Taylor | 338/166 |
| 4,050,050 | A | * | 9/1977 | Nakanishi et al. | 338/190 |
| 7,002,448 | B2 | * | 2/2006 | Reeb et al. | 338/199 |
| 7,042,211 | B2 | * | 5/2006 | Kabashima et al. | 324/207.25 |

FOREIGN PATENT DOCUMENTS

DE 102009048389 A1 5/2011

* cited by examiner

*Primary Examiner* — Kyung Lee
(74) *Attorney, Agent, or Firm* — MacMillan, Sobanski & Todd, LLC

(57) ABSTRACT

An optical proximity switch includes a potentiometer for setting a switching point and supported for rotation through multiple turns, a crosswheel supported for rotation and including a visible position index visible, and a cam drive rotatably coupled to the potentiometer and the crosswheel.

14 Claims, 2 Drawing Sheets

OPTICAL PROXIMITY SWITCH

BACKGROUND OF THE INVENTION

1. Field of the Invention

This invention relates generally to an optical proximity switch, particularly to adjusting the setting of a potentiometer.

2. Description of the Prior Art

Optical proximity switches are used as contactless electronic switches for monitoring purposes. They are used also in the automation industry.

Optical proximity switches include an optical transmitter; usually an LED or laser diode, for transmitting a light signal to a monitoring area; and at least one photodetector for receiving the light signal transmitted. If an object is located in the monitoring area, the light signal is interrupted or reflected, at least it is attenuated or its polarization direction changes. If the influence of the object on the light signal reaches a degree determined by a switching threshold, then a switching signal is tripped.

Switchgear of this kind is produced and sold in various embodiments and is commercially available from ifm electronic gmbh of Essen, Germany.

In an early stage of development the switching threshold was set with potentiometers, often multispeed spindle potentiometers because of their higher resolution. Later, especially with the arrival of microcontrollers, devices with automatic switching point setting by so-called teach-in methods came onto the market.

For displaying the set switching point, either self-illuminating LEDs and/or passive LCD displays are used. Self-illuminating LEDs and/or passive LCD displays increases not only the production costs but also the operating costs and put a thermal burden on the devices as well. Moreover, customers want the device setting to be recognizable in the currentless state even without aids, and want to set the device in the currentless state before installing it.

German Patent Disclosure DE 10 2009 048 389 A1 shows an arrangement for detecting more than one revolution. Especially the gear construction in FIG. 6 discloses a set of solutions that is suitable for attaining the object of the present invention. The magnetic coupling can be dispensed with. Its lack of a display unit is a disadvantage.

SUMMARY OF THE INVENTION

An optical proximity switch includes a potentiometer for setting a switching point and supported for rotation through multiple turns, a crosswheel supported for rotation and including a visible position index visible, and a cam drive rotatably coupled to the potentiometer and the crosswheel.

The setting of the multi-turn potentiometer is visible in the currentless state without aids and with high resolution.

The optical proximity switch connects the spindle of the multi-turn potentiometer to a crosswheel, which is provided with a position index visible to a user through a view port.

Only two additional components are necessary, namely the crosswheel itself and a cam drive disposed between a user control element and the potentiometer's spindle.

A screwdriver slot serves as a control element for the user. A rotation direction indicator indicates the directions of rotation that raise and lower the set value of the multi-turn potentiometer.

The potentiometer's angular travel is limited on both ends by stops on the crosswheel.

The optical proximity switch is especially suitable for optical proximity switches having adjustable fading out of the background, because then wide switching intervals can be set with high precision. The optical proximity switch can be used for all conventional proximity switches, such as inductive, capacitive or magnetic proximity switches, as long as they have a multi-turn potentiometer for setting the switching interval.

The scope of applicability of the preferred embodiment will become apparent from the following detailed description, claims and drawings. It should be understood, that the description and specific examples, although indicating preferred embodiments of the invention, are given by way of illustration only. Various changes and modifications to the described embodiments and examples will become apparent to those skilled in the art.

DESCRIPTION OF THE DRAWINGS

The invention will be more readily understood by reference to the following description, taken with the accompanying drawings, in which.

DESCRIPTION OF THE PREFERRED EMBODIMENT

Figure 1:
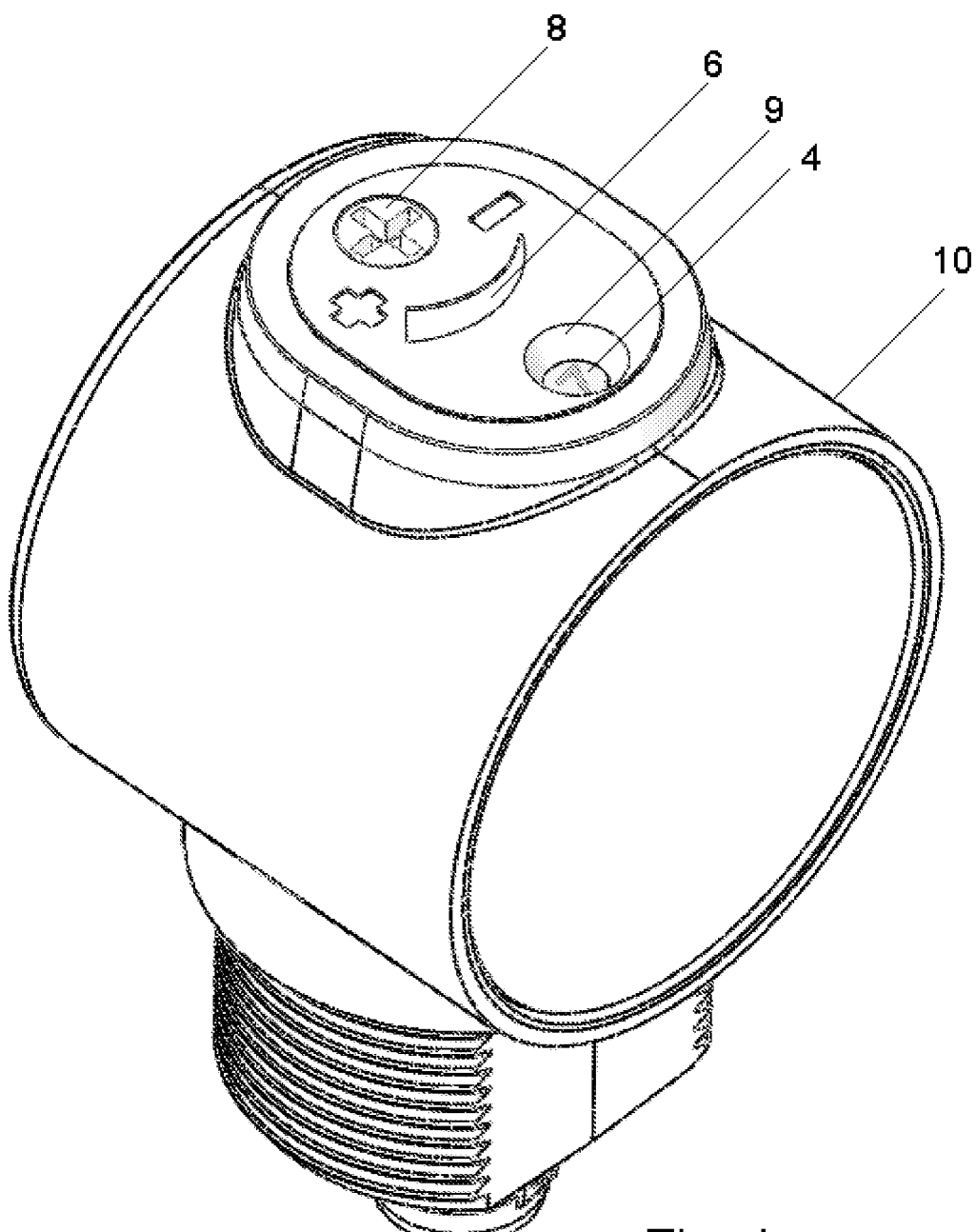
FIG. 1 shows the display unit of the optical proximity switch.
Figure 2:
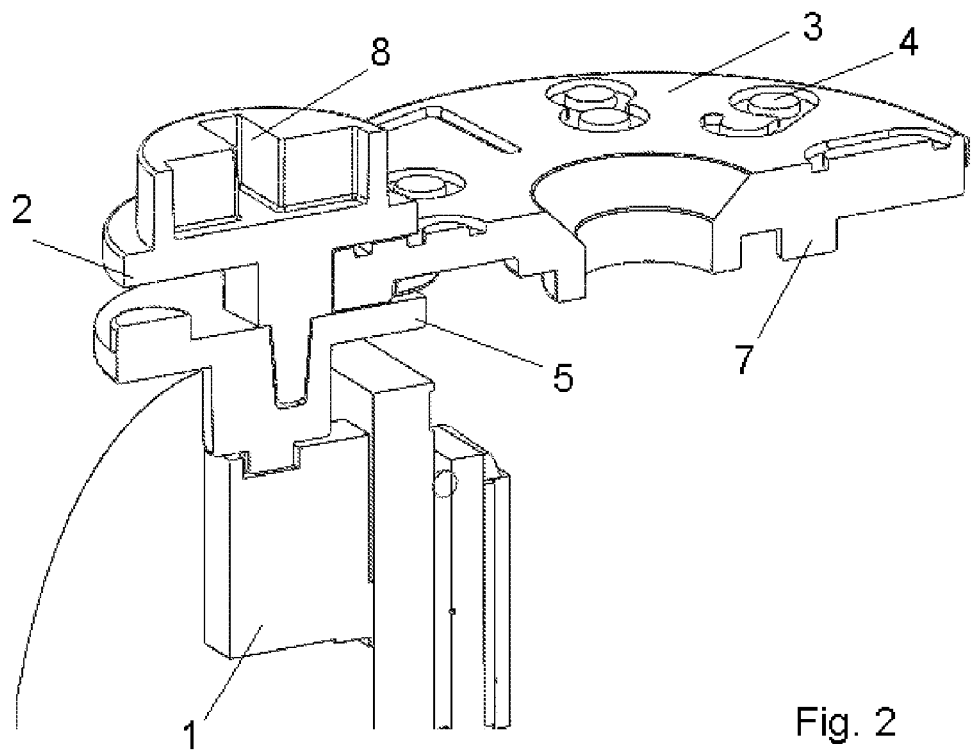
FIG. 2 shows a sectional view of the optical proximity switch.
Figure 3:
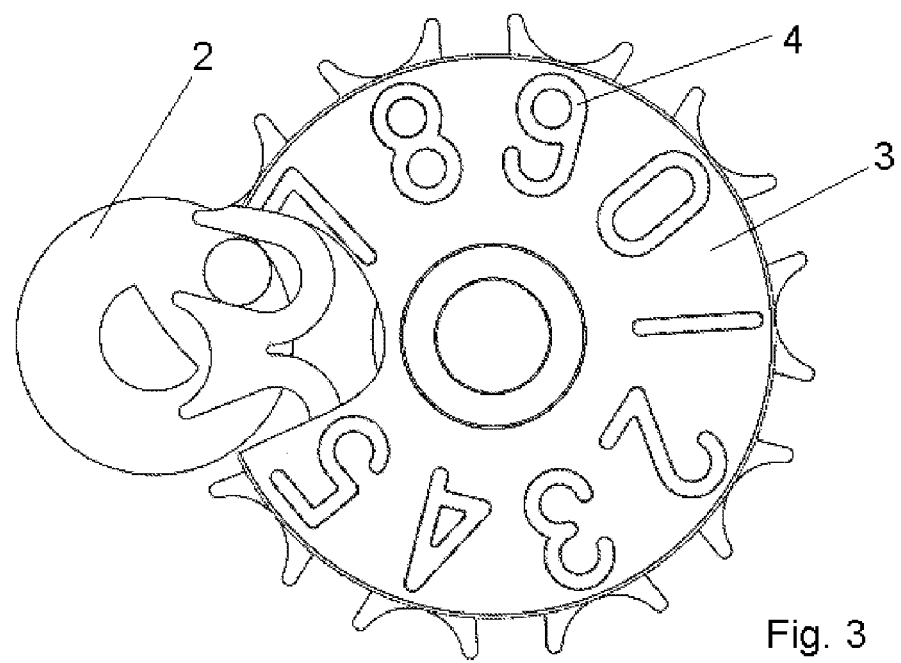
FIG. 3 shows a detailed view of a cross wheel.

FIG. 1 shows an optical proximity switch assembly, in which the setting and display unit is located on the top side of a housing 10. FIGS. 1, 2 and 3 show a crosswheel 3 located behind a view port 9. A position index 4 is carried on the crosswheel 3 and is visible to the user through the view port 9. A rotation direction indicator 6 and a slot 8, adapted to receive the tip of a screw driver, are also shown.

FIG. 2 shows, in a sectional view, details of the internal structure of the switch assembly, which includes a multi-turn potentiometer 1, cam drive 2, and the crosswheel 3.

The top side of the crosswheel 3 is labeled with numbers of the position index 4, each number representing the variable angular position of the crosswheel 3, each number becoming visible to the user as the crosswheel 3 rotates position index 4. In FIG. 1, number "7" of the position index 4 is visible to the user through view port 9.

User operation is effected via the screwdriver slot 8 on the cam drive 2. The cam drive 2 rotates both the crosswheel 3 and the spindle of the multi-turn potentiometer 1 when a screw driver, or another implement, located in slot 8 is rotated.

The cam drive 2 is connected to the spindle of the multi-turn potentiometer 1 via a cross-staff coupling 5. This takes care of the tolerances.

A stop 7 on the crosswheel 3 runs in a nearly full-circle guide groove (not shown), i.e., a slot in the housing 10. When stop 7 reaches an annular end of the guide groove, contact between the guide groove and stop 7 represents an annular reference position of the potentiometer 1 and cam drive 2 and serves to limit rotation of the potentiometer 1, cam drive 2 and crosswheel 3.

The position index 4 mounted on the crosswheel 3 matches the number of rotations of crosswheel 3 that are actually possible.

The actual position index 4 can be read through the view port 9 in the housing 10, as shown in FIG. 1.

The drive of the crosswheel 3 is designed such that after every complete rotation through 360 degrees of potentiometer 1 and cam drive 2, the position index 4 advances by precisely one numeral relative to the view port 9.

FIG. 3 shows the crosswheel 3 in detail and a mechanism that incrementally rotates the crosswheel 3 as the cam driver 2 is rotated manually. The top side is partly shown in transparent form, to make the mode of operation of the cam drive 2 visible. The mechanism angularly increments or decrements the position index 4 by the numeral visible through the view port 9 depending in the direction in which the slot 8 is rotated manually. Cam drive 4 and potentiometer 1 rotated in response to rotation of slot 8. Upon each complete rotation through 360 degrees of potentiometer 1 and cam drive 2, the crosswheel 3 and position index 4 rotate by precisely one numbered position on the position index 4 relative to the view port 9.

The cam drive 2 and potentiometer 1 rotate when a screwdriver or another implement, inserted into screwdriver slot 8, is rotated. If needed, the screwdriver slot 8 can be provided with an encoding, to protect against unauthorized use.

The invention is not limited to the drive by means of the screwdriver slot. All the possible variations of drives for manual operation can be considered. For instance, movement of the cam drive 2 can also be produced by means of a knurled wheel, preferably to be moved by means of a thumb, or a vane wheel, or a wheel with an indentation for the index finger.

| List of Reference Numerals | |
|---|---|
| 1 | Multi-turn potentiometer |
| 2 | Cam drive |
| 3 | Crosswheel |
| 4 | Position index |
| 5 | Cross-staff coupling |
| 6 | Rotation direction indicator |
| 7 | Stop |
| 8 | Screwdriver slot |
| 9 | View port |
| 10 | Housing |

In accordance with the provisions of the patent statutes, the preferred embodiment has been described. However, it should be noted that the alternate embodiments can be practiced otherwise than as specifically illustrated and described.

The invention claimed is:

1. An optical proximity switch, comprising:
   a potentiometer (1) for setting a switching point and supported for rotation through multiple turns;
   a crosswheel (3) supported for rotation and including a visible position index (4) visible;
   a cam drive (2) rotatably coupled to the potentiometer (1) and the crosswheel (3).

2. The optical proximity switch of claim 1, further comprising a cross-staff coupling (5) that driveably connects the cam drive (2) to the potentiometer (1).

3. The optical proximity switch of claim 1, further comprising a rotation direction indicator (6) that indicates rotary directions that increase and decrease, respectively, a degree to which the potentiometer (1) is rotated from a reference position.

4. The optical proximity switch of claim 1, wherein the crosswheel (3) includes a stop that limits rotation of the crosswheel.

5. The optical proximity switch of claim 1, further comprising a view port through which numerals on the position index can be seen.

6. The optical proximity switch of claim 5, wherein each of the numerals indicates a number of full rotations of the potentiometer (1).

7. The optical proximity switch of claim 5, wherein each of the numerals indicates a number of full rotations of the potentiometer (1) and cam drive (2) from a reference position.

8. The optical proximity switch of claim 1, wherein the cam drive further includes a slot adapted to receive therein an implement for rotating the cam drive.

9. An optical proximity switch, comprising:
   a potentiometer (1) for setting a switching point and supported for rotation through multiple turns;
   a crosswheel (3) supported for rotation and including a position index (4) having angularly spaced numerals;
   a view port (4) through which numerals on the position index can be seen;
   a cam drive (2) rotatably coupled to the potentiometer (1) and the crosswheel (3) and including a mechanism that changes an angular position of the position index by one of the numerals relative to the view port (4) for each rotation of the potentiometer.

10. The optical proximity switch of claim 9, further comprising a cross-staff coupling (5) that driveably connects the cam drive (2) to the potentiometer (1).

11. The optical proximity switch of claim 9, further comprising a rotation direction indicator (6) that indicates rotary directions that increase and decrease, respectively, a degree to which the potentiometer (1) is rotated from a reference position.

12. The optical proximity switch of claim 9, wherein the crosswheel (3) includes a stop that limits rotation of the crosswheel.

13. The optical proximity switch of claim 12, wherein each of the numerals indicates a number of full rotations of the potentiometer (1).

14. The optical proximity switch of claim 12, wherein each of the numerals indicates a number of full rotations of the potentiometer (1) and cam drive (2) from a reference position.

* * * * *